US005673015A

United States Patent [19]

Imamura et al.

[11] Patent Number: 5,673,015

[45] Date of Patent: Sep. 30, 1997

[54] SLIDING TYPE VARIABLE RESISTOR

[75] Inventors: Masao Imamura; Satoshi Hayasi, both of Maebashi, Japan

[73] Assignee: Tubame Musen Inc., Gunma, Japan

[21] Appl. No.: 385,172

[22] Filed: Feb. 7, 1995

[30] Foreign Application Priority Data

| | | | |
|---|---|---|---|
| May 19, 1994 | [JP] | Japan | 6-105714 |
| Nov. 14, 1994 | [JP] | Japan | 6-278920 |

[51] Int. Cl.[6] .......... H01L 10/38

[52] U.S. Cl. .......... 338/176; 338/118; 338/161; 338/184

[58] Field of Search .......... 338/74, 87, 117–118, 338/125, 133, 161, 176, 184, 160

[56] References Cited

U.S. PATENT DOCUMENTS

| | | | |
|---|---|---|---|
| Re. 28,026 | 5/1974 | Oka | 338/176 |
| 3,412,361 | 11/1968 | Lovejoy et al. | 338/176 |
| 3,550,059 | 12/1970 | Barden et al. | 338/176 |
| 3,566,330 | 2/1971 | Ichikawa | 338/176 |
| 3,671,915 | 6/1972 | Sasaki et al. | 338/183 |
| 3,735,327 | 5/1973 | Rozema et al. | 338/183 |
| 4,045,765 | 8/1977 | Imamura | 338/176 |
| 4,047,146 | 9/1977 | Takeyama | 338/176 |
| 4,274,074 | 6/1981 | Sakamoto | 338/160 |
| 4,479,107 | 10/1984 | Bleeke | 338/176 |
| 5,339,065 | 8/1994 | Slenker | 338/133 |

FOREIGN PATENT DOCUMENTS

| | | | |
|---|---|---|---|
| 979988 | 12/1975 | Canada | 338/176 |
| 2444994 | 4/1976 | Germany | 338/176 |
| 0101603 | 4/1989 | Japan | 338/74 |

*Primary Examiner*—Teresa J. Walberg
*Assistant Examiner*—Karl Easthom
*Attorney, Agent, or Firm*—Townsend & Banta

[57] ABSTRACT

The present invention provides a sliding type variable resistor in which the shaking of a knob portion is prevented, and in which the slider is able to slide smoothly. A sliding type variable resistor is provided having a structure comprising a resin substrate having a carbon film resistor printed on the surface in a straight line and lead terminals for external lines, a slider having a main body portion provided with a sliding shoe which slides in abutment against the carbon film resistor and a knob portion, and a frame body which holds the slider main body portion and the resin substrate inside and in which only the knob portion of the slider protrudes outside. A guide rail is provided in parallel to the sliding direction of the slider on the side surface of the frame body and a depressed part which is to be engaged with the above-mentioned guide rail is provided on the side surface of the slider main body portion.

3 Claims, 6 Drawing Sheets

SLIDING TYPE VARIABLE RESISTOR

FIELD OF THE INVENTION

The present invention relates to a sliding type variable resistor and, in particular, to a sliding type variable resistor in which the shaking of a knob portion is prevented and the slider is able to slide smoothly.

DESCRIPTION OF RELATED ART

Carbon film type variable resistors have been generally extensively utilized as variable resistors for use in radio receivers, audio amplifiers and TV receiving sets.

Carbon film type variable resistors are roughly divided into rotary types and sliding types. In the case of sliding types, since the knobs are moved back and forth or left and right, the order of adjustment can be known at a glance. Also, since a plurality of them can be installed in a small area, their use in audio mixers, electronic pianos, etc. is expanding.

The internal structure of a sliding type variable resistor is, as shown in FIG. 6(A), comprised of a resin substrate 3 made of bakelite, etc. having a carbon film resistor 1 printed on the surface in a straight line and lead terminals 2*a*, 2*b*, 2*c*, 2*d*, 2*e*, 2*f* for external lines, a slider 5 composed of a main body portion 5*a* having a sliding shoe 4 (a metallic thin film being rich in elasticity) which slides in the direction of an arrow in abutment against the carbon film resistor 1 and a knob portion 5*b*, and a frame body 6 (made of a metallic material such as tin-plate or aluminum) having the slider main body portion 5*a* and the resin substrate 3 inside and only the knob portion 5*b* of the slider 5 protruding outside.

FIG. 6(B) is a plan view of a sliding type variable resistor 20 of an exposed type which is further miniaturized and has no frame body and the slider slides while being directly held by a resin substrate. The sliding type variable resistor 20 is comprised of a resin substrate 13 having a carbon film resistor 11 printed on the surface in a straight line and lead terminals 12*a*, 12*b*, 12*c*, 12*d* for external lines, and a slider 15 being comprised of a main body portion 15*a* having a freely slidable sliding shoe 14 held by the resin substrate 13 which slides in the arrow direction in abutment against the carbon film resistor 11 and a knob portion 15*b*.

The basic structure of the sliding type variable resistor has been unchanged; however, because of the tendency in recent electronic equipment manufacturing to manufacture equipment which is lighter, thinner, shorter and smaller, further miniaturization and lower cost of sliding type variable resistors are required. In order to meet these requirements, improvements in downsizing and simplifying of constituent parts are being sought.

Attention can be paid to a mechanism which holds the slider main body portion 5*a* (15*a*) slidable, back and forth or left and right. In the case of the conventional sliding type variable resistor 10, the slider main body portion 5*a* is held simply by placing it between the upper surface 6*a* and the bottom surface 6*b* of the frame body 6. In the case of the sliding type variable resistor 20, the slider main body portion 15 holds only a side of the resin substrate 13. For example, in the case of the sliding type variable resistor 10, when the knob portion 5*b* is made to slide, as shown in the schematic view showing a sliding state of the sliding type variable resistor 10 in FIG. 6(C), there has been a problem in that the knob portion 5*b* is inclined in the sliding direction caused by a small gap between the slider main body portion 5*a* and the frame body 6 or the resin substrate 13 (refer to the arrow).

This disturbs the smooth adjustment of the resistance value. The same problem also occurs in the case of the exposed sliding type variable resistor 20 of the exposed type.

Another problem occurs when there is play in the movement of the knob portion 5*b*, the feeling during use becomes unpleasant, and the evaluation of a product is downgraded, and in some cases the product can be regarded as inferior.

In the case of a small sized sliding type variable resistor 6A, in particular, when dimension of the width X of the slider main body portion in comparison with the distance H between the upper side and the lower side of the frame body is insufficient, the knob portion is easily shaken.

Due to the problems described above, a sliding type variable resistor having the structure described below has been manufactured. A through hole has been provided in the slider main body portion in parallel to the sliding direction and a metallic bar, one end of which is fixed on the side surface of the frame body, is inserted into the through hole to prevent play in the sliding direction. In such case, an increase in the number of parts is unavoidable and the manufacturing process becomes complicated, thus increasing manufacturing cost and product size. An example of such a device is one in which a metallic spring or other similar elastic materials are employed to permanently press the slider main body portion against a frame body or resin substrate.

SUMMARY OF THE INVENTION

The present invention was invented in consideration of the circumstances described above. An object of the invention is to provide a sliding type variable resistor which has a shake preventing mechanism of a knob portion, while keeping the rise in cost as low as possible and which also meets the requirement of miniaturization of the equipment.

According to the present invention, it is possible to solve the above mentioned problems by offering two kinds of sliding type variable resistors described hereinafter. A sliding type variable resistor according to the present invention is comprised of a resin substrate having a carbon film resistor printed on the surface in a straight line and lead terminals for external lines, a slider having a main body portion provided with a sliding shoe which slides in abutment against the carbon resistor and a knob portion, and a frame body which holds the slider main body portion and the resin substrate inside and only the knob portion of the slider protruding outside. A slit or a guide rail is provided in parallel to the sliding direction in approximately the central part of the side surface of the frame body, and a protruded portion or a depressed portion which is to be engaged with the above-mentioned slit or guide rail is provided on the side surface of the slider main body portion.

Another sliding type variable resistor according to the present invention is comprised of a resin substrate having a carbon film resistor printed on the surface in a straight line, and a slider having a main body portion provided with a sliding shoe which is held so as to be freely slidable by the resin substrate and slides in abutment against the carbon film resistor and a knob portion. A slit or a guide rail is provided in parallel to the sliding direction of the slider in approximately the central part of the resin substrate, and a protruded part or a depressed part which is to be engaged with the above-mentioned slit or guide rail is provided on the bottom surface of the slider main body portion on the side of the resin substrate.

In addition, according to the present invention, it is possible to solve the aforementioned problems by offering two kinds of sliding type variable resistors as hereinafter described. According to the present invention, a sliding type variable resistor is comprised of a resin substrate having a carbon film resistor printed on the surface in a straight line and lead terminals for external lines, a slider composed of a main body portion provided with a sliding portion which slides in abutment against the carbon resistor and a knob portion, and a frame body which holds the slider main body portion and the resin substrate inside and only the knob portion of the slider outside protrusively. A guide rail inside is provided in parallel to the sliding direction of the slider between the approximately central part, and the knob portion is to be engaged with the above mentioned guide rail, and the top surface of the frame body is provided on the side surface of the slider main body portion.

Figure 1:
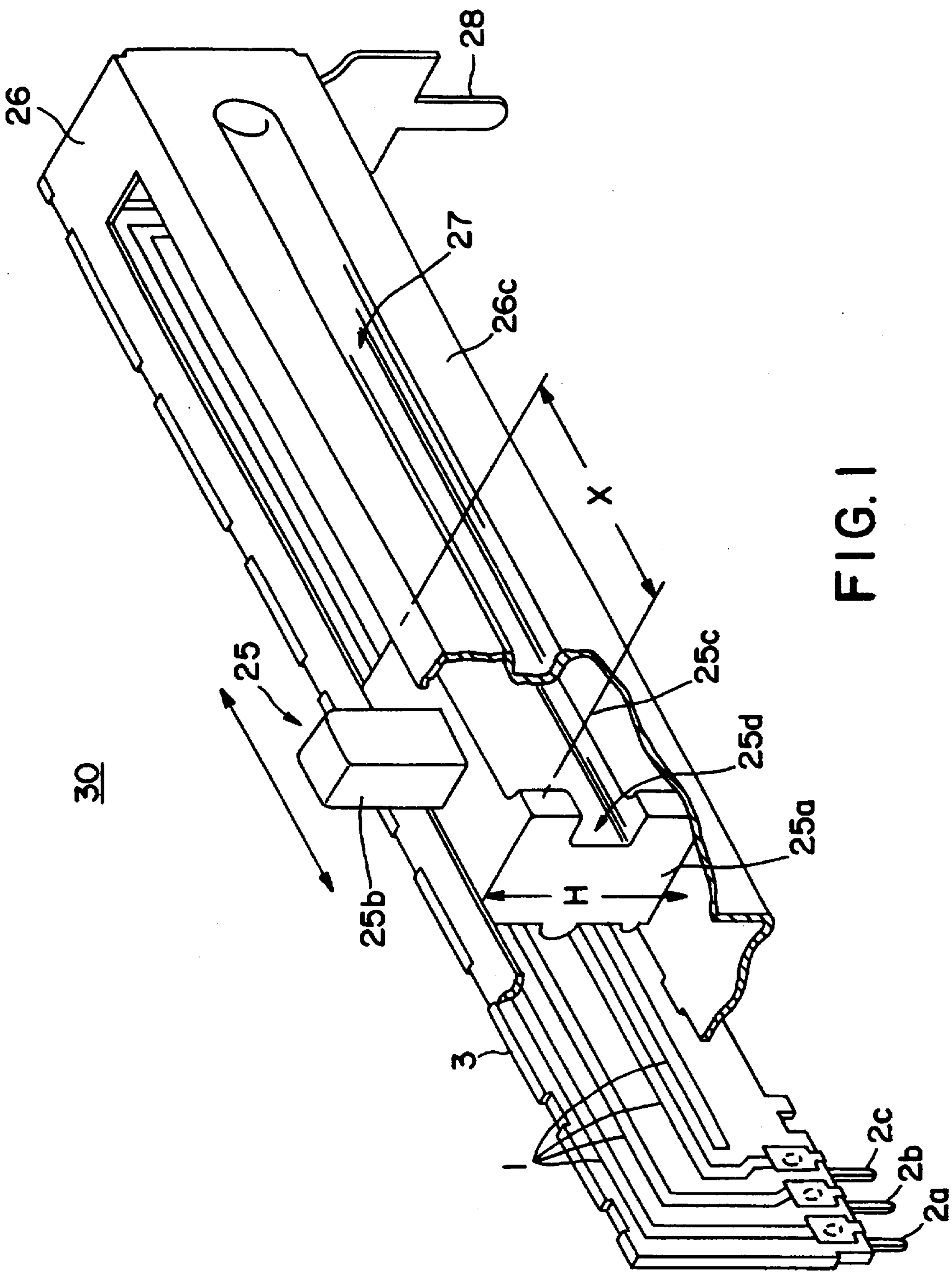
FIG. 1 is a perspective view, partially cut away, showing the structure of a sliding type variable resistor according to the present invention.

A sliding type variable resistor according to the present invention comprises a structure described as follows:

(1) A slit is provided in parallel to the sliding direction in the central part of the side surface of the frame body, and a protruding part which is to be engaged with the above-mentioned slit is provided on the side surface of the slider main body, so that the shaking of the slider is controlled by the abutting surfaces between the upper and lower end surfaces of the slit and the protruding part of the slider main body portion.

In another example, a protruding guide rail is provided in parallel to the sliding direction on the inside of approximately the central part of the side surface of the frame body, and a depressed area which is to be engaged with the above-mentioned guide rail is provided on the side surface of the slider main body portion, so that shaking of the slider in the sliding direction is controlled by the abutting surfaces between the upper and lower end surfaces of the guide rail and the depressed part of the slider main body portion.

In the case of a conventional device, the control of the shaking of a slider main body portion in the sliding direction depends on a control distance H, i.e., the distance between the upper end and the lower end of the slider main body portion (H: an inner dimension between the upper and lower ends of the frame body which is approximately equal to the vertical dimension of the slider main body portion). However, in the case of a device according to the present invention, shaking is controlled by the distance between the upper end surface and the lower end surface of the slit or the guide rail, and the control distance H' is equal to the width dimension of the slit or the guide rail, and the ratio of the distance H' to the width dimension X of the slider main body portion in the sliding direction (X/H') becomes larger, thereby the play angle in the sliding direction approaches approximately 0, it is possible to remarkably improve control over the shaking of the slider.

(2) The slit, the guide rail, and the depressed part or the protruded part can be formed simultaneously with the forming of other parts, so that an increase in manufacturing cost is negligible.

(3) Next, in the case of a sliding type variable resistor of an exposed type, in which a frame body is removed and a slider slides while being held directly by a substrate, similar to above, a slit (a through hole or a groove) or a guide rail is provided in parallel to the sliding direction in approximately the central part of the resin substrate and a protruded part or a depressed part which is to be engaged with the above-mentioned slit or guide rail is provided on the bottom surface of the slider main body portion on the side of the resin substrate, so that, similar to above, the slide in the sliding direction is controlled so as to have no play angle by the control function of the abutting surfaces, making it possible to prevent shaking of the slider in the sliding direction by close engagement.

Next, the sliding type resistor is provided with a guide rail which protrudes inside in parallel to the sliding direction of the slider between the approximately central part and to the knob portion of the side surface of the frame body, and a slider main body portion is provided with a protruding part which is engaged with the space between said guide rail on the side surface and the top surface of said slider main body. The shaking of the slider is controlled by the abutting surfaces between the upper end surface of above-mentioned guide rail or inner wall of the top surface of the frame body, and the upper and lower abutting surface of the protruding part of the side surface of the slider main portion.

Consequently, in the above-mentioned case (1), the slider is able to slide smoothly. Therefore, the slide in the sliding direction is controlled more closely by part of the knob portion, the slide is pushing the knob portion, and the vertical load on the abutting portion on the controlled slider by the leverage becomes small.

A preferred embodiment of a sliding type variable resistor according to the present invention will be explained by reference to the drawings.

A portion or a part of which has the same shape or performs the same function as that of the above-mentioned conventional device will be shown by the same symbol as that of the conventional one.

As shown in FIG. 1, a sliding type variable resistor 30 is comprised of a resin substrate 3 having a carbon film resistor 1 printed on the surface in a straight line and lead terminals 2a, 2b, 2c for external lines, and a slider 25 having a main body portion 25a. The main body portion 25a is provided with a sliding shoe 4 (shown in FIG. 3(A)) which slides in abutment against the carbon film resistor 1 and a knob portion 25b, and a frame body 26 holding the slider main body 25a and the resin substrate 3 inside and only the knob portion 25b of the slider 25 protrudes outside. A guide rail 27 is provided in parallel to the sliding direction, as shown by arrow, on the side surface 26c of the frame body 26, and a depressed part 25d which is to be engaged with the guide rail 27 is provided on the side surface 25c of the slider main body 25a. There are fixing pieces 28 for fixing the variable resistor to a mounted substrate on both sides of the frame body.

Figure 2:
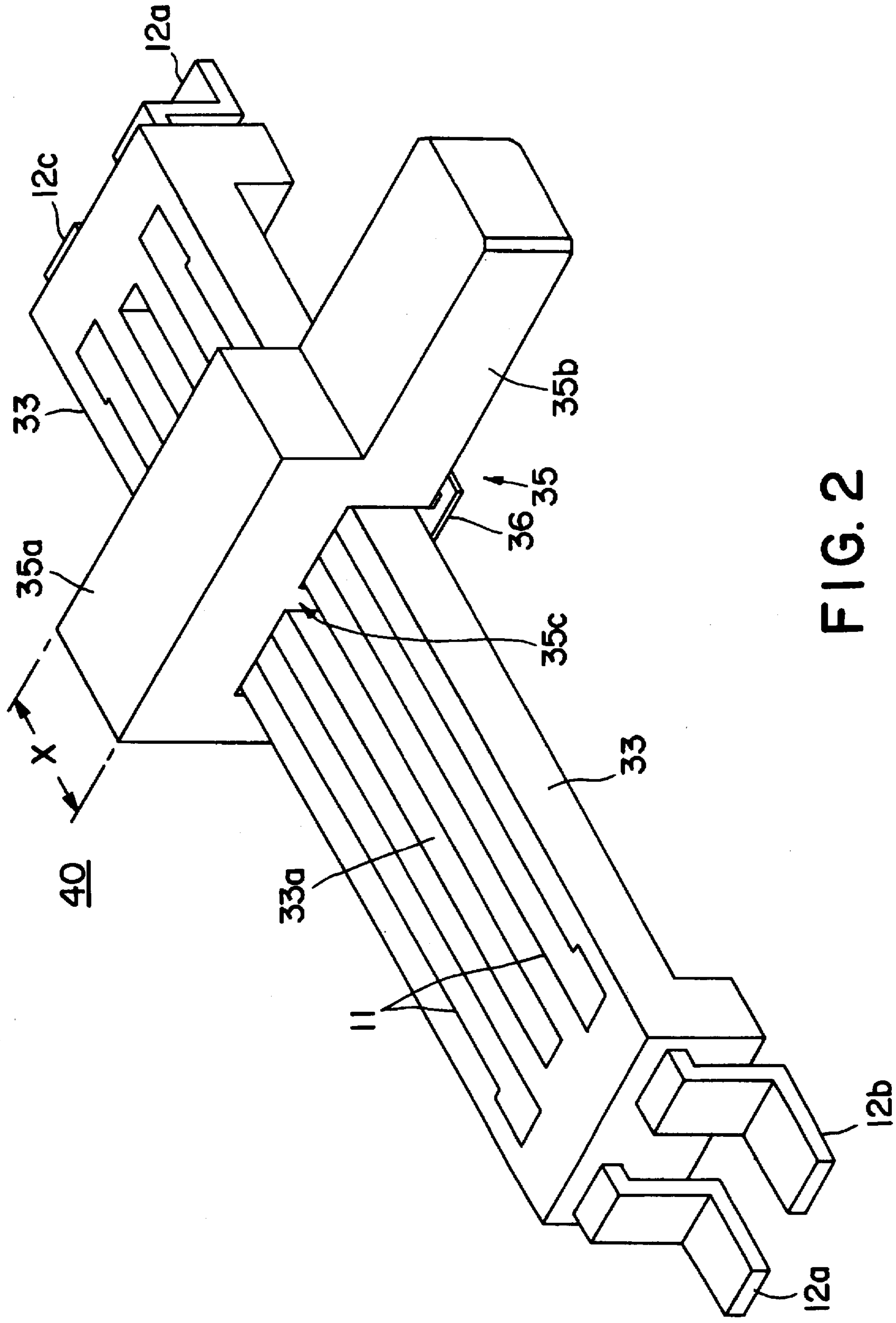
FIG. 2 is a perspective view, showing the structure of an exposed sliding type variable resistor of the present invention.
Figure 3A:
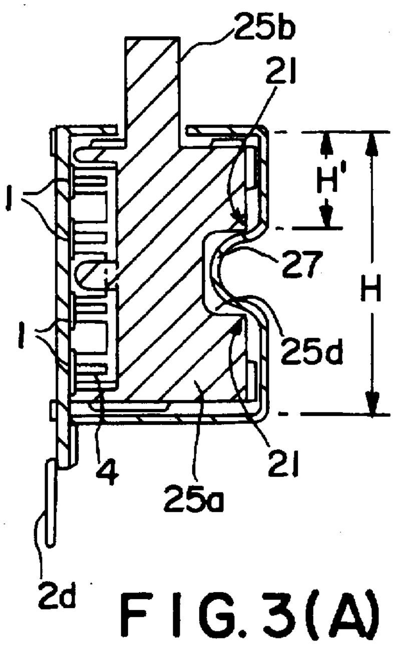
FIG. 3(A) is a cross sectional view showing the engagement relation between the slider and the guide rail of the frame body of a sliding type variable resistor of the present invention.
Figure 3B:
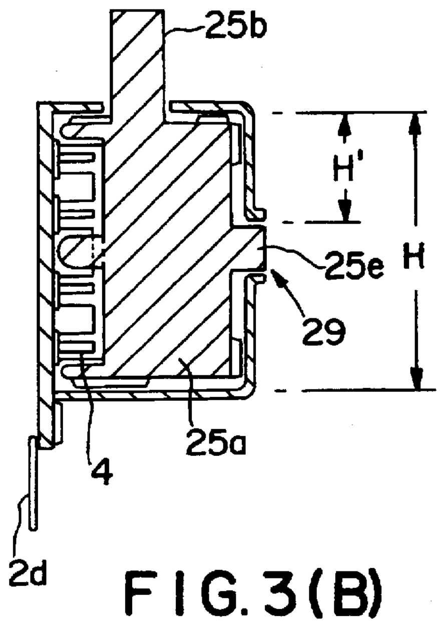
FIG. 3(B) is a cross sectional view showing the engagement relation between the slider and the slit of the frame body of a sliding type variable resistor according to the present invention.
Figure 3C:
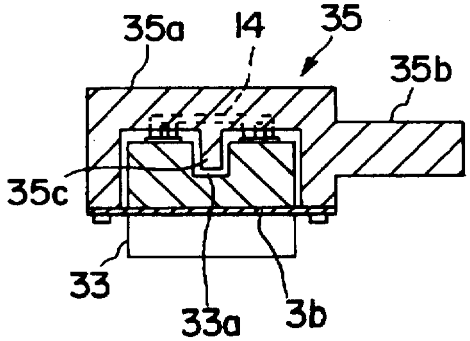
FIG. 3(C) is a cross sectional view showing the engagement relation between the slider and the slit on the resin substrate of a sliding type variable resistor of an exposed type.

Next, as shown in FIG. 2, a sliding type variable resistor 40, referred to as an exposed type sliding type variable resistor, comprises a resin substrate 33 having a carbon film resistor 11 printed on the surface in a straight line and lead terminals 12a, 12b, 12c, 12d for external lines provided on both ends of the substrate, and a slider 35 having a main body portion 35a provided with a sliding shoe 14 (refer to FIG. 3(C)) which is held freely slidable in the longitudinal direction of the resin substrate 33 and slides in abutment against the carbon film resistor 11 and a knob portion 35b. A slit 33a is provided in parallel to the sliding direction of the slider 35 on the resin substrate 33, and a protruded part 35c which is to be engaged with the slit 33a is provided on the bottom surface of the slider main body portion on the side of the resin substrate. The knob portion 35b is of a type which protrudes from the slider main body portion 35a in the direction parallel to the resin substrate surface.

Next, the above-mentioned parts will be explained in detail. As shown in FIG. 2, the resin substrate 3 of the sliding type variable resistor 30 is a substrate made of an insulating synthetic resin, such as phenol resin, about 1 mm thick, and a carbon film, as the carbon film resistor 11, is printed (baked) on the surface. Individual connecting points of the carbon film resistor 11 are connected to the lead terminals 2a, 2b, 2c for external lines, respectively, through the terminals to which silver paste is applied.

The frame body 26, as shown in FIG. 1, is similar to those of the conventional devices, made of a metallic material such as tin or aluminum, or a synthetic resin.

The slider 25 is also made of a synthetic resin. For example, polyamide, PBT, PET, PPS, etc., having excellent abrasion resistance properties, are appropriate materials.

The sliding shoe 4, shown in FIG. 3A, is made by bundling fine metallic wires into a brush shape or formed by bending conductive thin metallic plates of about 0.1 mm thick, plated with silver while maintaining elasticity. It is made to slide by the slider 25, shown in FIG. 1, in abutment against the carbon film resistor 11 to change electrically connected points and to vary the resistance values between an end of the resistor 11 and respective electrically connected points, that is, the lead terminals 2a, 2b, 2c in a predetermined range.

The sliding type variable resistor 40 has a structure similar to that of the variable resistor 30, and the dimensions of the resin substrate are, at the minimum, 1.5 mm thick, 20 to 25 mm long, and 3 to 4 mm wide, and phenol resin, polyamide, etc. are appropriate construction materials.

A thin plate 36 is fixed by caulking on the back surface of the slider 35, such that the slider 35 may not be taken off from the resin substrate 33 (refer to FIG. 3(C)).

The shaking prevention effect, to be described later, can be obtained even when the slit 33a is replaced by a complete through hole or a depressed groove provided on the surface, and the "slit" in the present invention is a term which includes additional meanings.

From a resin substrate manufacturing process standpoint, in the case of a phenol resin substrate, a through hole is easier to work, and in the case of a resin mold, both a through hole and a groove are easy to work.

The shake prevention effect, occurring when the slider 25 (35) is slid, will be described in detail. In a conventional case the control distance H, as seen in FIG. 3, is determined by the distance between the upper end and the lower end of the slider main body portion 25a (35a) (which is an inner vertical dimension of the frame body and approximately equal to the height of the slider main body portion). However, in the case of the present invention the control distance is made smaller, to H', which is determined by the width of the guide rail 27 or the width of the slit 33a, and the ratio of H' to X, the width of the slider main body portion 25a (35a) in the sliding direction, is made large and the play angle of shaking in the sliding direction can be regarded to be approximately 0.

In other words, when the width of the guide rail 27 or the width of the slit 33a is set smaller or closer, the depressed part 25d or protruded part 35c of the slider main body portion can be engaged with the guide rail 27 or the slit 33a in an abutting state against their upper and lower end surfaces, which increases the control power in the sliding direction.

Figure 3D:
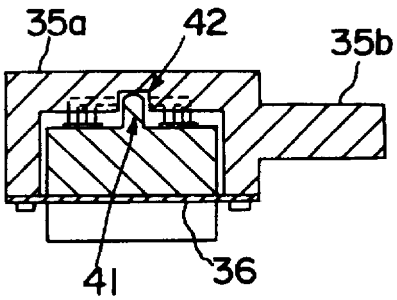
FIG. 3(D) is a cross sectional view showing the engagement relation between the slider and the guide rail of the frame body of a sliding type variable resistor according to the present invention.

In the case of an exposed type sliding type variable resistor 40 of an exposed type which has no frame body, similar to the above, a slit 33a (refer to FIG. 3(C)) or a guide rail 41 (refer to FIG. 3(D)) is provided in parallel to the sliding direction of the slider in approximately the central part of the resin substrate, and a protruding part 35c or a depressed part 42 which is to be engaged with the above-mentioned slit 33a or guide rail 41 is provided on the bottom surface of the slider main body portion 35a on the side of the resin substrate. Thereby, the movement in the sliding direction can be controlled without play by the same function described in the above and the shaking in the sliding direction of the slider can be prevented.

Figure 4:
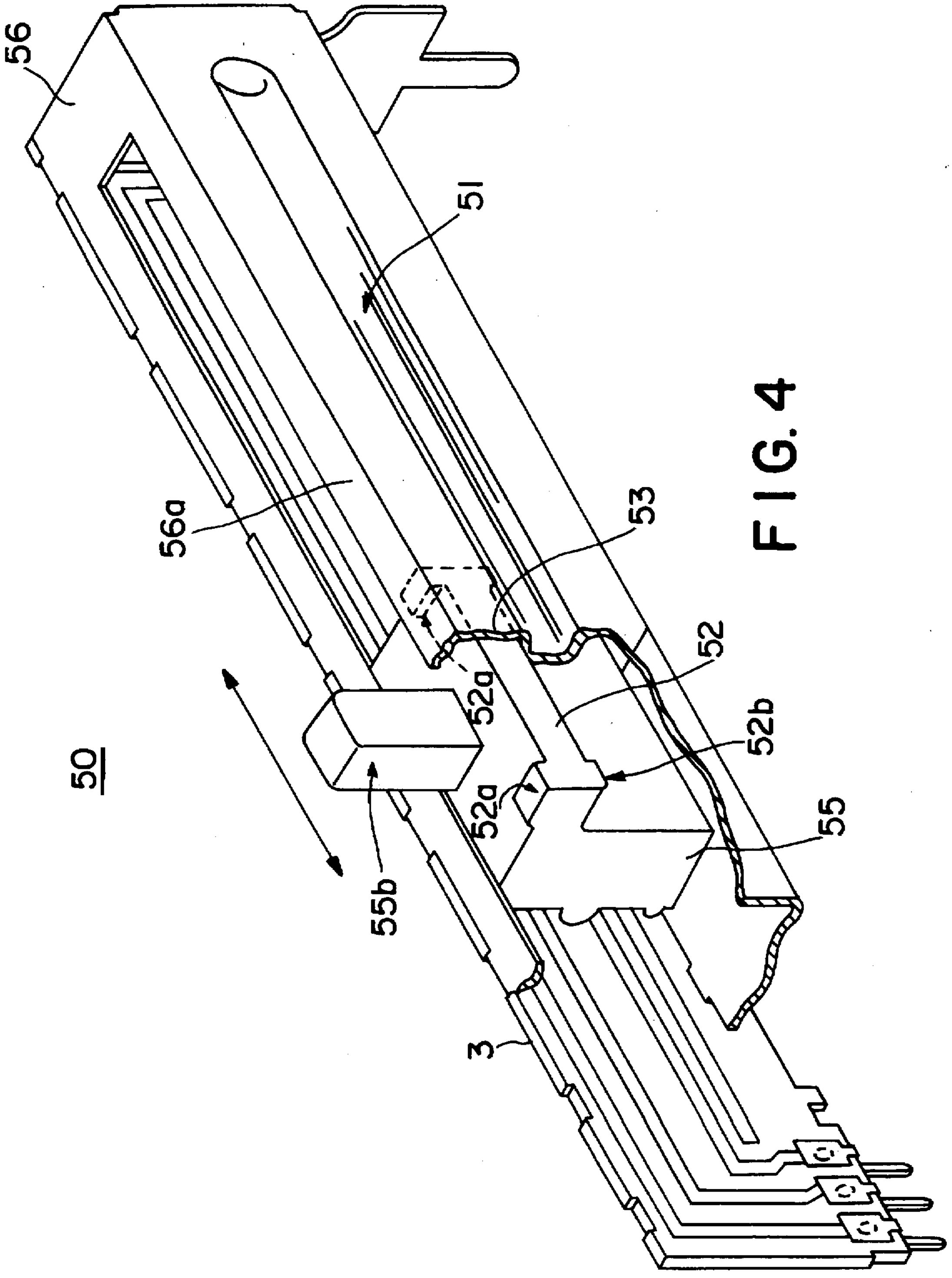
FIG. 4 is a perspective view, partially cut away, showing the relation of the engagement between the slider of a sliding type variable resistor and the relation of the pushing pressure on the knob portion when pressure is applied and the vertical load on the abutting point with the frame body and the slider.

As shown in FIG. 4, a sliding type variable resistor 50, which has a similar outward appearance with the aforementioned sliding type variable resistor 30, wherein said frame body is provided with a guide rail protruding inside between the approximately central part of frame body and the knob portion 55b, and without said slider main body portion being provided with a depressed part which is to be engaged with said guide rail, provided with a protruded part which is to be engaged with the space between said guide rail on the side surface and the top surface of said slider main body portion.

The shaking of the slider is controlled by the top end surface of the above-mentioned guide rail 51 and inner wall of the top surface 56a of the frame body 56, the upper and lower abutting surface 52a, 52b of the protruded part 52 of the side surface of said slider main body 55.

Figure 5A:
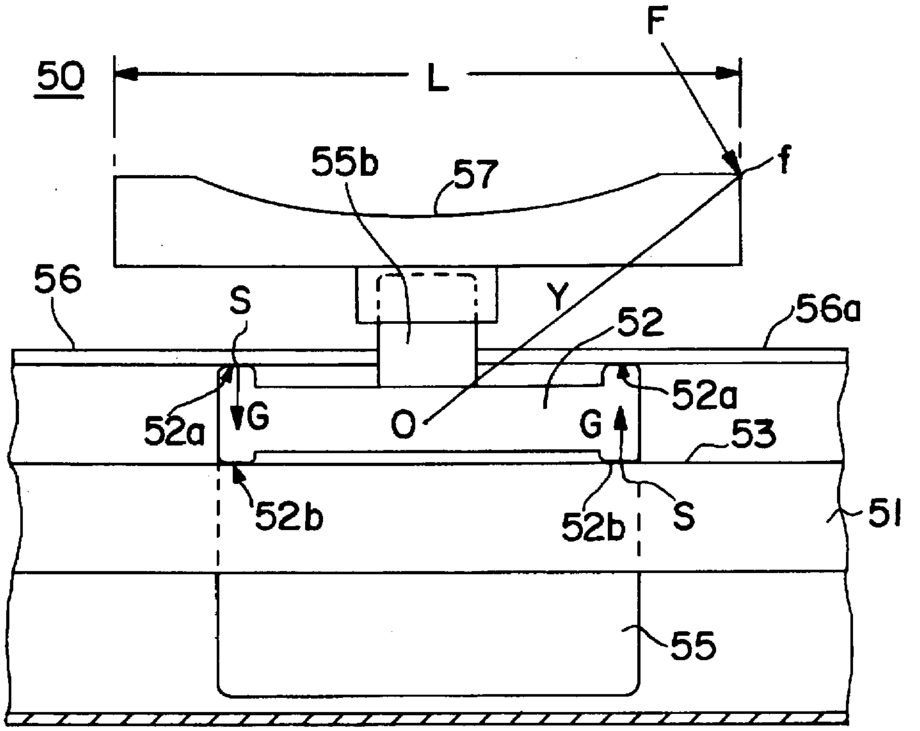
FIGS. 5A and 5B show a comparison between the sliding type variable resistor with the relation of the pushing pressure on the knob portion when used, and the vertical load on the abutting point with the frame body of the slider.
Figure 5B:
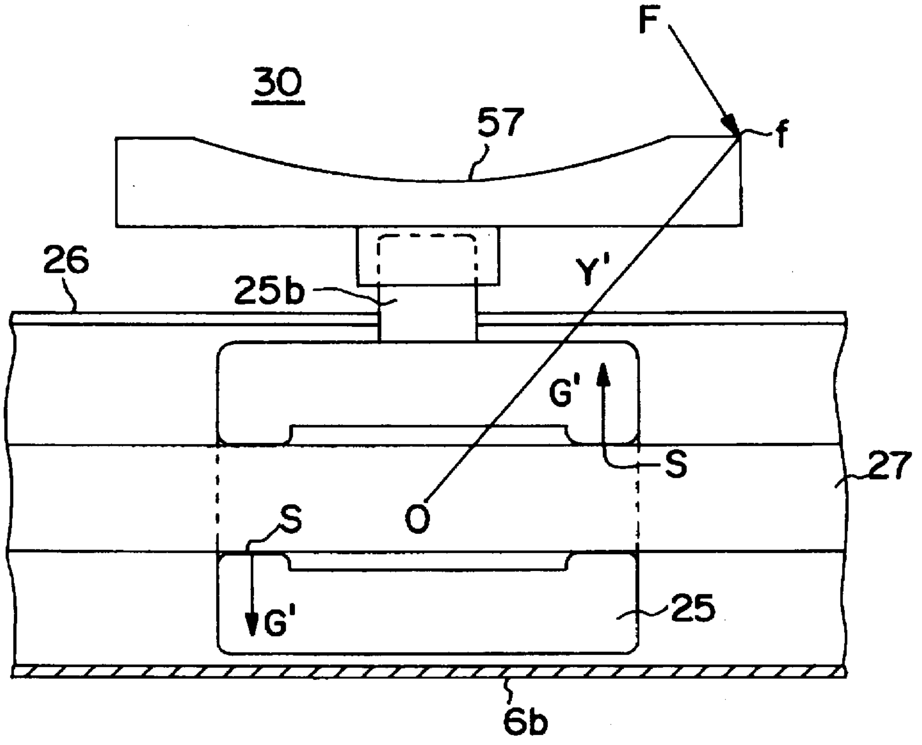
Figure 6A:
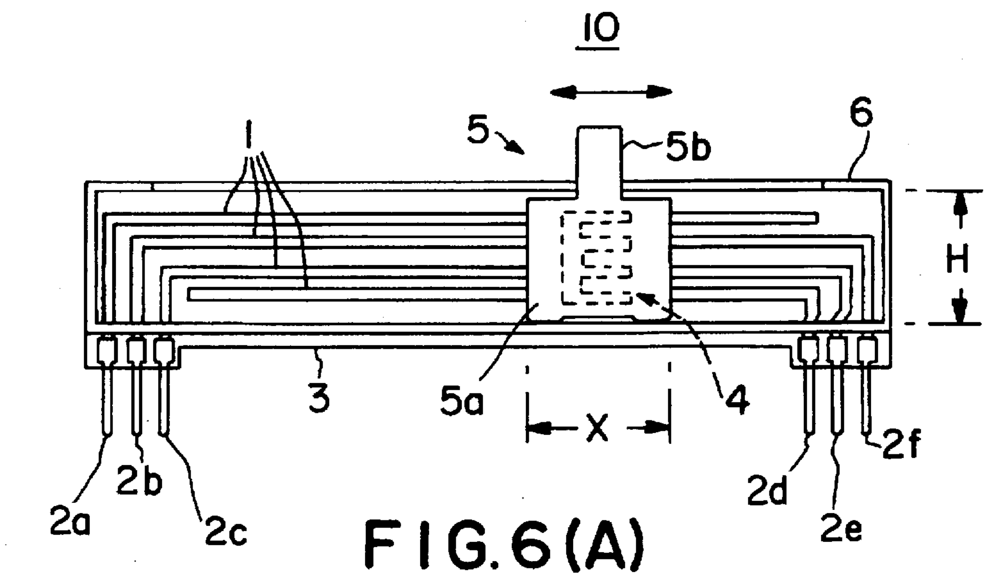
FIG. 6(A) is a front view showing the internal construction of a conventional sliding type variable resistor.
Figure 6B:
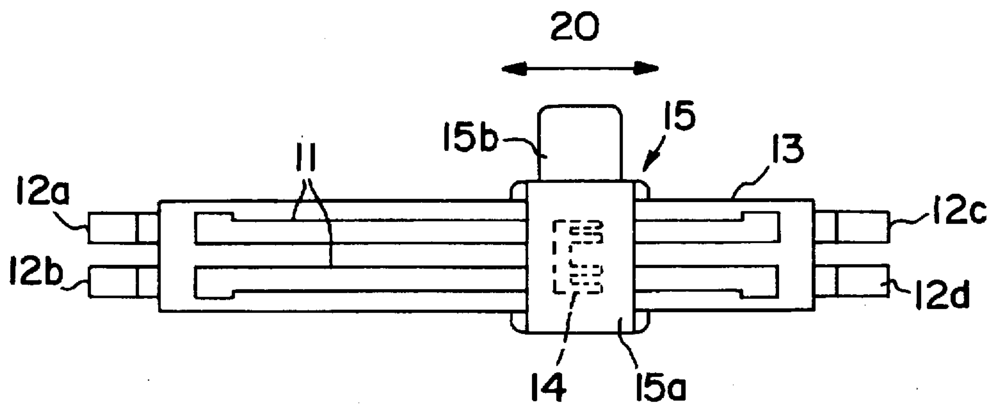
FIG. 6(B) is a plan view showing a conventional sliding type variable resistor of an exposed type.
Figure 6C:
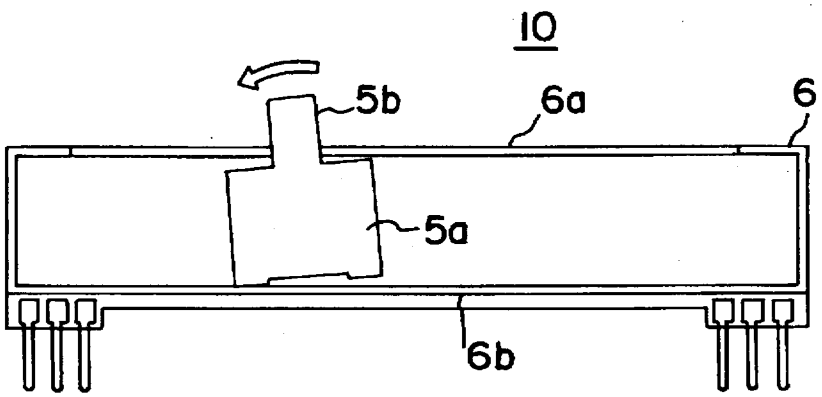
FIG. 6(C) is a schematic view showing the shaking state of a sliding type variable resistor when slid.

Therefore, combined with the case of above-mentioned sliding type resistor 30, the slide of the slider 50 in the sliding direction is controlled more closely by part of the knob portion 55b. For instance, as shown in FIG. 5(A), a large knob 57 is provided with a knob portion 55b of the slider, and the slide is pushed by the end of said knob portion 57. This shows that the distance Y between the point where force is applied f and the fulcrum O is shorter, and the vertical load G on the abutting portion S of the controlled slider 55 by the changed leverage is smaller than the vertical load G' of the sliding type variable resistor 30 as shown in the FIG. (B).

Aforementioned vertical load G is the vertical component of the force F of the point f where force is applied on the knob portion 55*b* by leverage and is proportional to the distance Y and changed several times, and the resistance force against the sliding direction. When the length in the sliding direction L of the knob portion 57 is long, the vertical load G becomes larger and it is hard to slide.

Accordingly, when using the large knob 57 as provided on the knob portion 55 of the slider, the user usually slides the end of said knob portion 57 by pushing, and it can be more smoothly slid than the sliding type resistor 50.

In addition, as shown in FIG. 5(A), the above-mentioned guide rail 51 is provided in close proximity to the knob portion 55*b* of the slider 55 parallel to the sliding direction, so that the distance Y becomes shorter and the result will be better. While it must be securely attached, the strength of said protruding part for above-mentioned protruding part 52 becomes thinner.

The slit 29 or 33*a*, the guide rail 27 or 41, the depressed part 25*d* or 42 and the protruded part 25*e* or 35*c* on the side surface of the slider main body portion, of the above-mentioned sliding type variable resistor 30 or 40, as shown in FIG. 3, can be manufactured by press forming or injection molding simultaneously with other parts, so that the rise in manufacturing cost can be made negligibly small, and no complicated process need be added in the assembling work.

Smooth sliding is made possible by applying grease to the abutting surfaces between a slit or a guide rail and a depressed part or a protruded part of the slider main body portion.

It is preferable that the position of a slider have a shape in which the abutting surface of a depressed part or a protruded part of the slider main body portion against a slit or a guide rail is not confined to the whole surface of the depressed or protruded part but, for example, as shown in FIG. 1, protruded parts are provided on the four corners of the slider for limiting the abutting surfaces only to the surfaces of the protruded parts.

The shape of the depressed part or the protruded part of the slider and the sectional shape of the slit or the guide rail of the frame body or the resin substrate shown in the preferred embodiment are not limited to a rectangular shape shown in the embodiment, and they can be a circular form or other various forms. However, when consideration is paid to the engagement degree or to the dimensional accuracy in working, a rectangular shaped section as shown in the embodiment is preferable.

Additionally, the number of guide rails or slits is not limited to one, as shown in the embodiment, and rather it can be two or three.

A sliding type variable resistor according to the present invention has the structure described above; therefore, it exhibits effects as follows:

(1) There is an excellent effect in which the slide of the knob portion in the sliding direction is stabilized and the shaking of the knob is prevented.

(2) There is another excellent effect in which the prevention of the shaking of the slider is able to correspond to the miniaturization of a sliding type variable resistor without increasing the cost.

(3) There is an excellent effect in which the slider is slid smoothly when the large knob is utilized, by pushing on the end of the knob portion, on the sliding type variable resistor.

What is claimed is:

1. A sliding type variable resistor comprising a resin substrate having side walls and a carbon film resistor printed on a one wall between said side walls, said film resistor being printed in a straight line on said one wall and lead terminals for external lines, and a slider having a knob portion and a main body portion provided with a sliding shoe which is freely slidable on said resin substrate and which slides in abutment against said carbon film resistor, said resin substrate having a slit in a parallel sliding direction to said slider and approximately central to said resin substrate, and said slider main body portion having a protruding part which operates in sliding engagement with said slit formed in said resin substrate, said protruding part on said main body portion protruding from a wall of the slider which is adjacent said film resistor printed on said one wall of said resin substrate, said main body portion of the slider abutting against and in sliding engagement with said side walls of the resin substrate.

2. A sliding type variable resistor comprising a resin substrate having side walls and a carbon film resistor printed on a one wall between said side walls, said film resistor being printed in a straight line on said one wall and lead terminals for external lines, and a slider having a knob portion and a main body portion provided with a sliding shoe which is freely slidable on said resin substrate and which slides in abutment against said carbon film resistor, said resin substrate having a protruding part in a parallel sliding direction to said slider and approximately central to said resin substrate, and said slider main body portion having a slit adapted to operate in sliding engagement with said protruding part formed in said resin substrate, said slit on said main body portion extending inwardly from a wall of the slider which is adjacent said resin substrate, said main body portion of the slider abutting against and in sliding engagement with said side walls of the resin substrate.

3. A sliding type variable resistor comprising a resin substrate having on one surface thereof a carbon film resistor printed in a straight line and lead terminals for external lines, a slider having a knob portion and being comprised of a main body portion, said main body portion being provided with a sliding shoe which slides in abutment against said carbon film resistor, and a unitary frame body defining an open area boundary and mounted therein the slider main body portion and mounted on said resin substrate, wherein only the knob portion of the slider extends through the frame body, said frame body being provided with a first guide rail in the form of a protrusion formed integral with one wall of said frame body, said first guide rail extending inwardly toward said main body portion of the slider and extending parallel to the sliding direction of said slider between approximately a central part of said one wall of said frame body and a wall of the frame body which extends from said one wall and which is adjacent the knob of said slider, and said slider main body portion being provided with a second guide rail comprising two protrusions which both abut in sliding engagement with said first guide rail and said wall which extends from said one wall.

* * * * *